(12) United States Patent
Kawasumi

(10) Patent No.: US 6,490,214 B2
(45) Date of Patent: Dec. 3, 2002

(54) SEMICONDUCTOR MEMORY DEVICE

(75) Inventor: Atsushi Kawasumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/024,249

(22) Filed: Dec. 21, 2001

(65) Prior Publication Data

US 2002/0080670 A1 Jun. 27, 2002

(30) Foreign Application Priority Data

Dec. 26, 2000 (JP) ........................................ 2000-394559

(51) Int. Cl.$^7$ ................................................. G11C 7/02
(52) U.S. Cl. ..................... 365/210; 365/185.2; 365/207
(58) Field of Search ............................... 365/210, 185.2, 365/207

(56) References Cited

U.S. PATENT DOCUMENTS

| | | | | |
|---|---|---|---|---|
| 4,551,820 A | * | 11/1985 | Matsuura | 365/210 |
| 4,751,681 A | * | 6/1988 | Hashimoto | 365/207 |
| 5,317,537 A | * | 5/1994 | Shinagawa et al. | 365/210 |
| 6,181,626 B1 | * | 1/2001 | Brown | 365/210 |
| 6,219,290 B1 | * | 4/2001 | Chang et al. | 365/207 |
| 6,246,622 B1 | * | 6/2001 | Sugibayashi | 365/210 |

FOREIGN PATENT DOCUMENTS

| | | | |
|---|---|---|---|
| EP | 0383080 A2 | * 1/1990 | ............ 11/40 |
| JP | 06-176568 | 6/1994 | |

OTHER PUBLICATIONS

B. Amrutur, et al., "A Replica Technique for Wordline and Sense Control in Low-Power SRAM's", IEEE Journal of Solid-State Circuits, vol. 33, No. 8, Aug. 1998, pp. 1208-1219.

* cited by examiner

Primary Examiner—Richard Elms
Assistant Examiner—Tuan T. Nguyen
(74) Attorney, Agent, or Firm—Banner & Witcoff, Ltd.

(57) ABSTRACT

A semiconductor memory circuit including a plurality of bit lines, memory cells connected to each of said plurality of bit lines, sense amplifiers, each corresponding to one of said plurality of bit lines and each configured to amplify a voltage of the corresponding bit line, dummy bit lines, a plurality of dummy cells connected to said dummy bit lines, a dummy sense amplifier configured to output signals with voltages obtained by amplifying the voltages of said dummy bit lines, and to set an activation timing of said sense amplifier based on the output, and a dummy cell selecting circuit configured to simultaneously select at least two of the dummy cells, when the sense amplifier is activated.

12 Claims, 6 Drawing Sheets

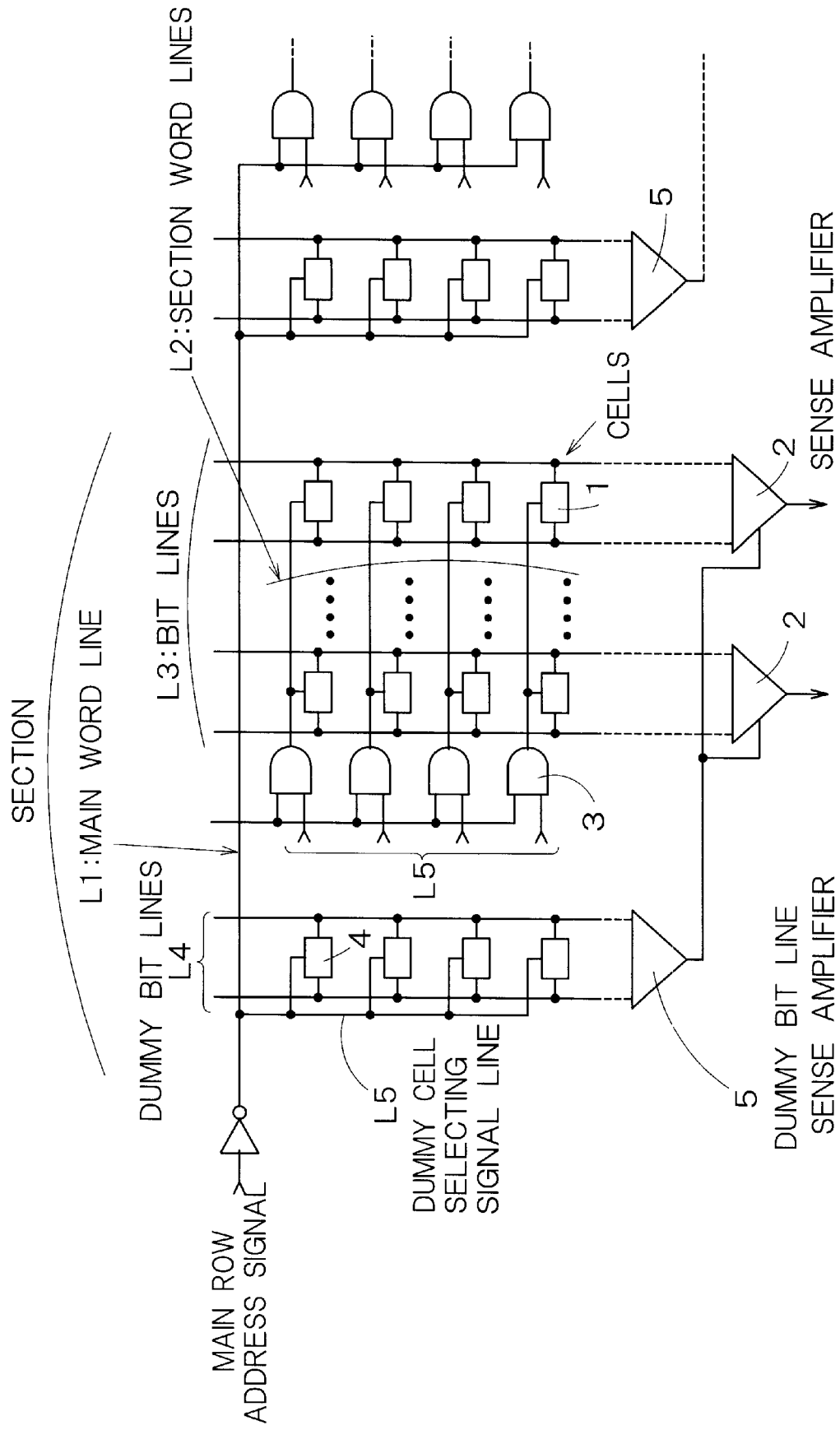
F I G. 1

SEMICONDUCTOR MEMORY DEVICE

CROSS REFERENCE TO RELATED APPLICATIONS

This application is based upon and claims the benefit of priority from the prior Japanese Patent Applications No. 2000-394559, filed on Dec. 26, 2000, the entire contents of which are incorporated herein by reference.

BACKGROUND OF THE INVENTION

1. Field of the Invention

The present invention relates to a semiconductor memory circuit for setting an activation timing of a sense amplifier connected to memory cells, by using a dummy bit line sense amplifier connected to a dummy cell.

2. Related Background Art

FIG. 6 is a block diagram showing schematic configuration of a conventional semiconductor memory circuit having the dummy bit line sense amplifier 5. The semiconductor memory device of FIG. 6 is composed of a pair of dummy bit lines L4 arranged in parallel to a bit line L3, a plurality of dummy cells 4 connected between the pair of dummy lines L4, and a dummy bit line sense amplifier 5 connected to one end of the dummy bit line L4.

Ordinary memory cells 1 are selected in units of row, when a main word line L1 is set to high level, one of section word lines L2 is set to high level, and one of modulated word-line address L5 is set to high level. Each of the dummy cells 4 is usually provided by each of the section word lines L2.

Only one dummy cell 4 of a plurality of dummy cells 4 can be selected by a dummy cell selecting signal, and the other dummy cells 4 are constantly in non-selecting state. When the dummy cell selecting signal is in low level, data stored in the dummy cell 4 is provided to the dummy bit line 4.

The dummy bit line sense amplifier 5 amplifiers the voltage of the dummy bit line L4 to output the amplified output. Activation timing of the sense amplifier 2 is set by the output of the dummy bit line sense amplifier 5.

When it is necessary to conform capacitance of the dummy bit line L4 to capacitance of an ordinary bit line L3, a cell that access is impossible may be connected to the dummy bit line L4.

Furthermore, if a width of the dummy bit line L4 is conformed to that of the bit line L3, resistance of both bit lines can be equal to each other. Moreover, if element sizes of transfer transistors and driver transistors in the dummy cell 4 are conformed to that of each transistor in the memory cell 1, cell current flowing through both cells can be set equal to each other.

When there is provided with the dummy bit line sense amplifier 5 such as FIG. 6, even if processes such as a cell current, a bit line resistance or a bit line capacitance fluctuate, timing that the dummy bit line sense amplifier 5 activates the sense amplifier in accordance with the fluctuation also changes, thereby preventing malfunction. It is possible to assure timing margin for readout by arranging the dummy cell 4 at farthest location from the sense amplifier on the bit lines.

However, if there is a random dispersion on properties such as the cell current and the capacitance, the time for sensing the dummy cells 4 also fluctuates at random. According to circumstances, the timing that the dummy bit line sense amplifier 5 activates the sense amplifier may quicken. In this case, it is impossible to normally sense data read out from the memory cell 1. In order to avoid such a problem, if sufficient margin is given to a sense start timing of the dummy cells 4, sense time of the memory cell 1 becomes too late.

Furthermore, conventionally, because control of the dummy cell 4 had been carried out separate from that of the memory cells 1, when the cell current of the dummy cell 4 and the timing of the dummy cell selecting signal largely changes due to the process fluctuation, data read out from the memory cell 1 may be unable to normally sense by the sense amplifier 2 or the sense timing may become too late.

SUMMARY OF THE INVENTION

A semiconductor memory circuit according to an embodiment of the present invention, comprising:

a plurality of bit lines;

memory cells connected to each of said plurality of bit lines;

sense amplifiers, each corresponding to one of said plurality of bit lines and each configured to amplify a voltage of the corresponding bit line;

dummy bit lines;

a plurality of dummy cells connected to said dummy bit lines;

a dummy sense amplifier configured to output signals with voltages obtained by amplifying the voltages of said dummy bit lines, and to set an activation timing of said sense amplifier based on the output; and a dummy cell selecting circuit configured to simultaneously select at least two of said dummy cells, when said sense amplifier is activated.

BRIEF DESCRIPTION OF THE DRAWINGS

FIG. 1 is a diagram showing internal configuration of a first embodiment of a semiconductor memory circuit according to the present invention;

DESCRIPTION OF THE PREFERRED EMBODIMENTS

Figure 2:
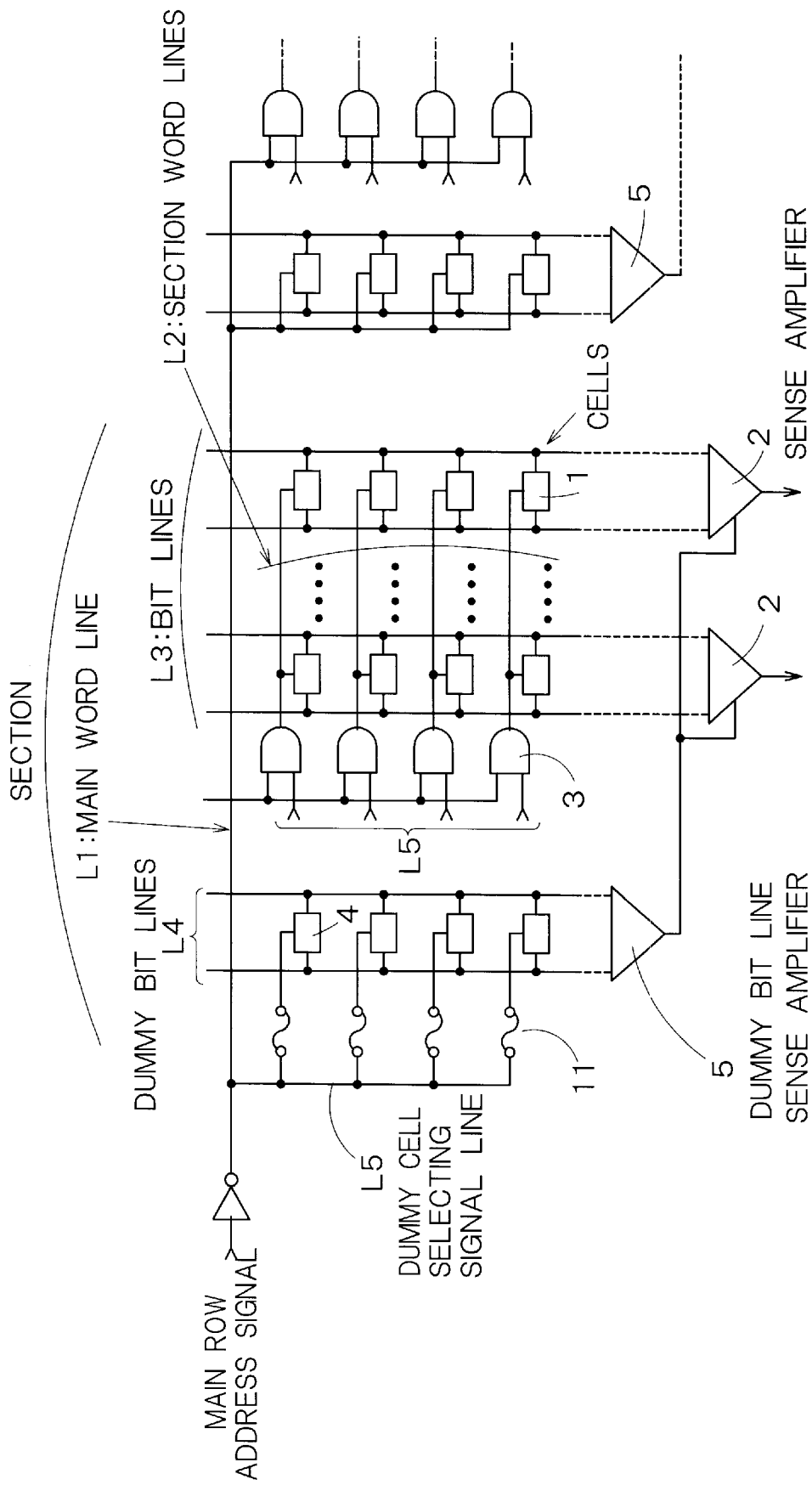
FIG. 2 is a block diagram capable of changing the number of dummy cells selected simultaneously.

Hereinafter, a semiconductor memory device according to the present invention will be specifically described with reference to drawings.

(First Embodiment)

FIG. 1 is a block diagram showing internal configuration of a first embodiment of a semiconductor memory device according to the present invention. The semiconductor memory device of FIG. 1 is composed of a main word line L1 and a plurality of section word lines L2 each arranged in row direction, a plurality pairs of bit lines L3 arranged in column direction, a plurality of memory cells 1 connected to the bit lines L3 and the section word lines L2, a plurality of sense amplifiers 2 each connected to one end of the corresponding bit line L3, a word line selecting circuit 3 for selecting the section word lines, a pair of dummy bit lines L4 arranged in substantially parallel to the bit lines L3, a plurality of dummy cells 4 connected between the dummy bit lines L4, and a dummy bit line sense amplifier 5 connected to one end of the dummy bit lines L4.

At least one of the dummy bit lines L4 is provided by each of the main word lines. In the present embodiment, each of the dummy bit lines L4 is provided in units of a section composed of a plurality of bit lines L3. It is desirable to conform a channel width and a channel length of transistors in the dummy cell 4 to those of transistors in the memory cell 1.

Figure 6:
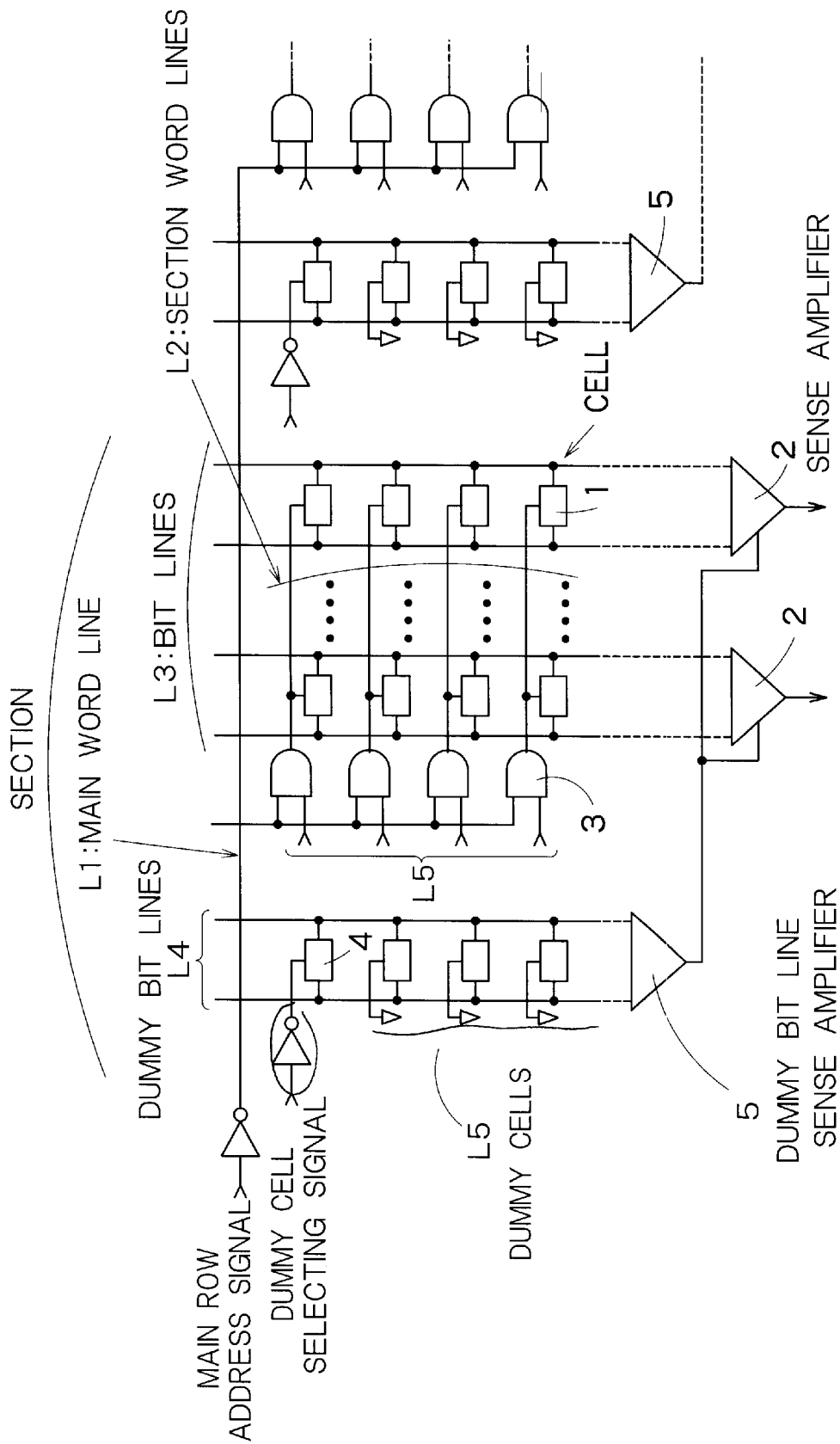
FIG. 6 is a block diagram showing schematic configuration of a conventional semiconductor memory circuit having a dummy bit line sense amplifier.

The semiconductor of FIG. 1 is composed in the same way as that of FIG. 6, except that connecting form of the dummy cells 4 is different from FIG. 6. All the dummy cells 4 of FIG. 1 are connected to the dummy bit line L4. When the main row address signal is in low level, all the dummy cells 4 are selected. Accordingly, if prescribed data is stored in advance in all the dummy cells 4, it is possible to increase current flowing through the dummy bit lines 4. Thus, the main word line that the main row address signal passes through corresponds to a dummy cell selecting circuit.

Each of the dummy cells 4 of FIG. 1 is provided by each of the section word lines L2. It is unnecessary to conform the number of the dummy cells 4 to the number of the section word lines L2. The number of the dummy cells 4 selected simultaneously may be equal to or more than two. More specifically, it is desirable to set the number of the dummy cells 4 to be two, and to be equal to or less than the number of one column of the memory cells 1.

The number of the dummy cell 4 selected simultaneously may be able to be arbitrarily set. For example, as shown in FIG. 2, fuses may be provided between the main word line L1 and the dummy cells 4, respectively. In this case, the number of the dummy cells 4 selected simultaneously may be set by controlling the number of the cut-off fuses. Therefore, even if the characteristics of the sense amplifier 2 or the dummy bit line sense amplifier 5 changes due to fluctuation of the processes, it is possible to cancel out the characteristic change by adjusting the number of the fuses.

Figure 3A:
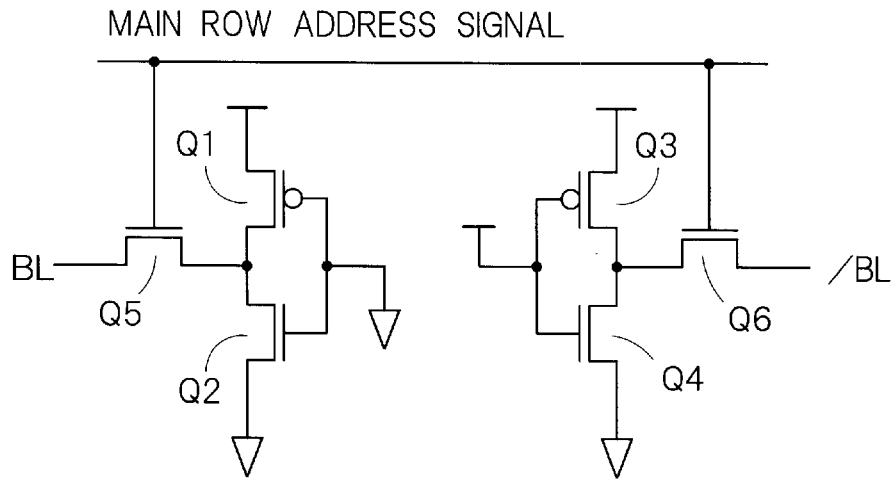
FIGS. 3A to C are circuit diagrams showing internal configuration of the dummy cells.
Figure 3B:
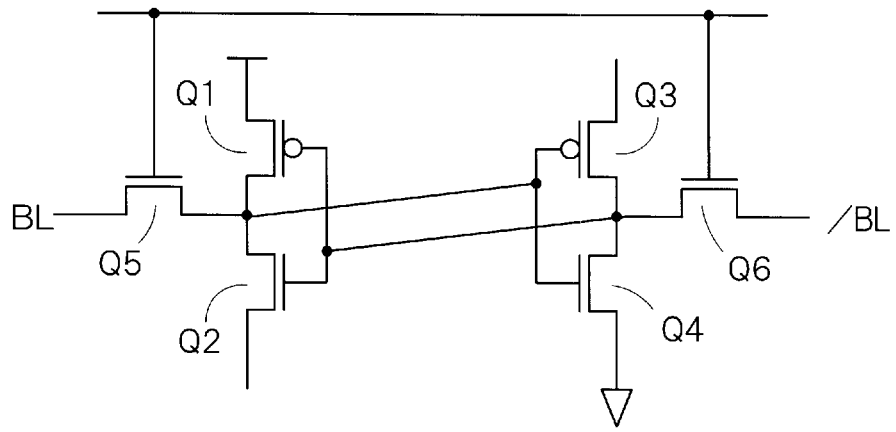
Figure 3C:
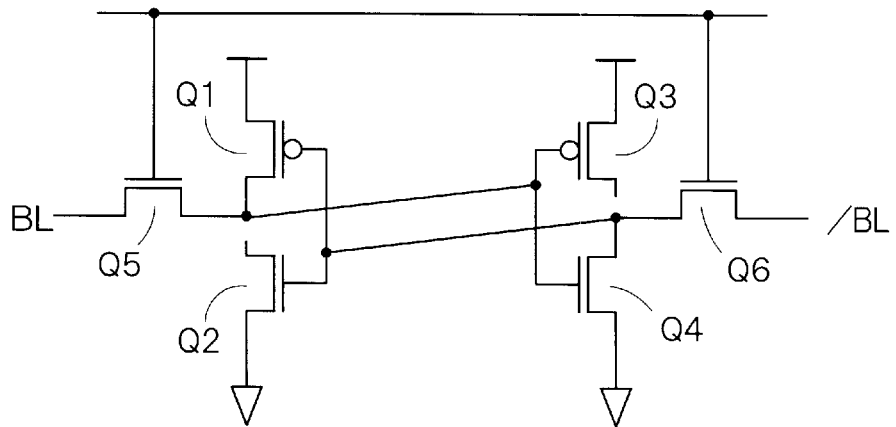

The dummy cells 4 of FIG. 1 can be composed of a circuit such as FIG. 3A, 3B or 3C. The dummy cell 4 of FIG. 3A is composed of transistors (Q1, Q2) and (Q3, Q4) composing an inverter, and transistors Q5 and Q6 turned ON/OFF by the main row address signal. When the main row address signal becomes low level, the transistors Q5 and Q6 turn ON, the bit line BL becomes high level, and the bit line /BL becomes low level.

In the dummy cell 4 of FIG. 3B, both of gate terminals of transistors Q1 and Q2 composing an inverter are connected to both of drain terminals of transistors Q3 and Q4 composing an inverter, and both of gate terminals of the transistors Q3 and Q4 are connected to both of drain terminals of the transistors Q1 and Q2. A source terminal of the transistor Q2 and a source terminal of the transistor Q3 are opened. In the circuit of FIG. 3B, when the main row address signal becomes low level, one of the outputs BL and /BL becomes high level and the other becomes low level.

In the dummy cell 4 of FIG. 3C, a drain terminal of the transistor Q2 and a drain terminal of the transistor Q3 are opened.

Next, operation of the semiconductor memory device of FIG. 1 will be described. When the main row address signal becomes low level and the main word line becomes high level, all the dummy cells 4 become selecting state, and a voltage of the dummy bit lines L4 changes in accordance with data stored in each of the dummy cells 4.

The dummy bit line sense amplifier 5 amplifies the voltage of the dummy bit lines L4 in order to output the amplified output. In the semiconductor memory circuit of FIG. 1, because all the dummy cells 4 are simultaneously accessed, input current increases as compared with that of the conventional dummy bit line sense amplifier 5. Accordingly, the dummy bit line sense amplifier 5 operates at higher speed. Therefore, the output of the sense amplifier 2 also quickly changes.

The output of the dummy bit line sense amplifier 5 is inputted to a control terminal of the sense amplifier 2 for sensing the output of the ordinary memory cell 1. Accordingly, the faster the operating speed of the dummy bit line sense amplifier 5 becomes, the faster the activation timing of the sense amplifier 2 becomes.

Thus, according to the present embodiment, a plurality of dummy cells 4 are connected to the dummy bit lines L4, and when the main row address signal is set to a low level, at least two of the dummy cells 4 are simultaneously selected. Because of this, it is possible to increase the magnitude of the signal inputted to the dummy bit line sense amplifier 5 as compared with the conventional circuit, thereby speeding up the operation of the dummy bit line sense amplifier. Accordingly, it is possible to advance the activation timing of the sense amplifier 2. When data read out from the ordinary memory cell 1 is sensed, because the sense amplifier 2 has already been activated, it is possible to stabilize the operation of the sense amplifier 2.

Because a plurality of dummy cells are selected at the same time, it is possible to reduce dispersion of current flowing through the dummy bit lines. Furthermore, because the main word line is used in order to select the dummy cell, even if the selecting time of the main word line fluctuates, the selecting time of the dummy cell also changes in accordance with the fluctuation, thereby improving margin of the sense timing.

(Second Embodiment)

The second embodiment has a feature in which there is provided with a dedicated signal to select the dummy cell.

Figure 4:
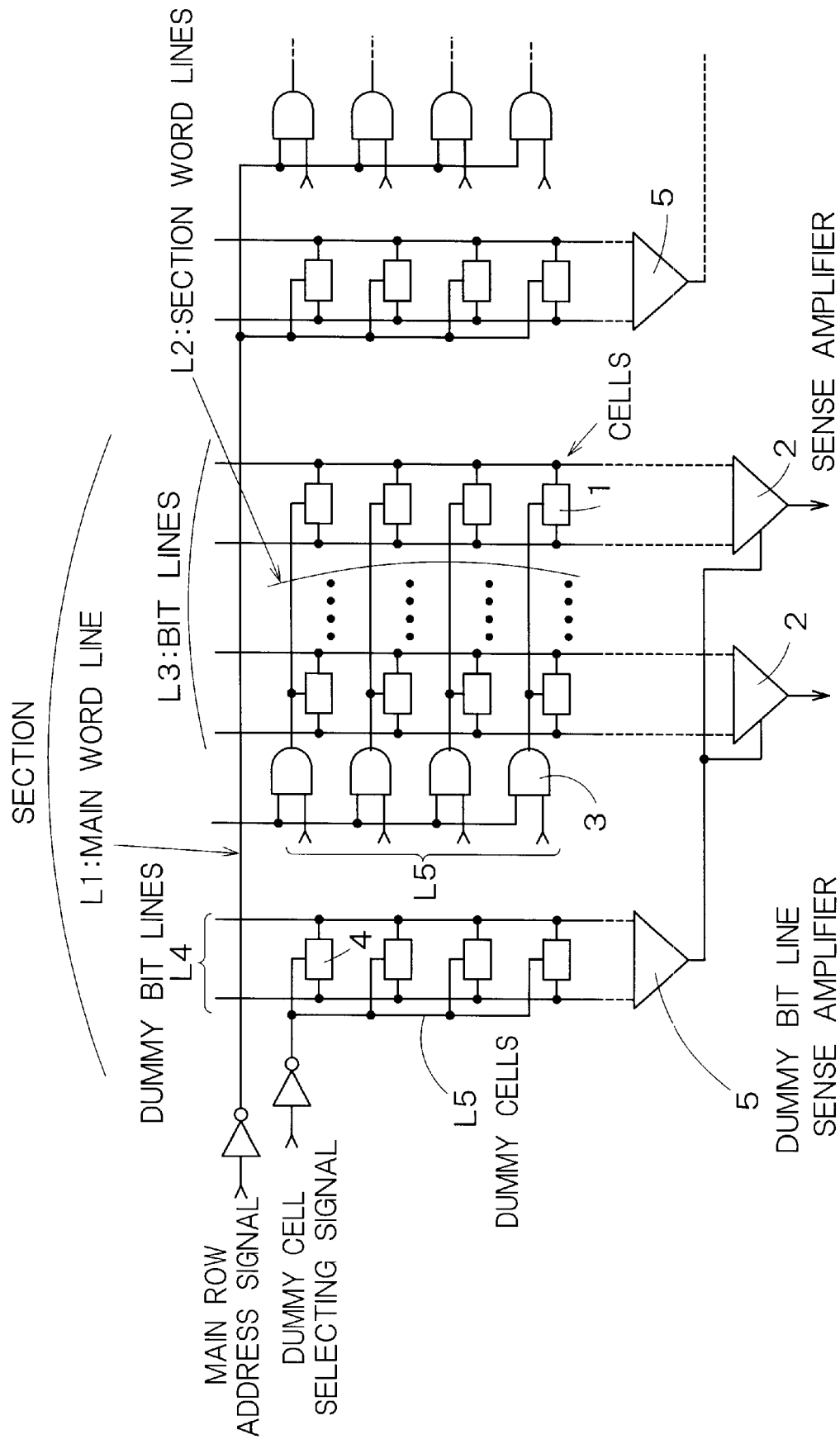
FIG. 4 is a block diagram of a second embodiment of a semiconductor memory circuit according to the present invention.

FIG. 4 is a block diagram of a second embodiment of a semiconductor memory circuit according to the present invention. In FIG. 4, the same reference numerals are attached to common constituents with FIG. 1. Hereinafter, differences will mainly be described.

In the semiconductor memory circuit of FIG. 4, a plurality of dummy cells 4 are connected to the dummy bit lines L4. These dummy cells 4 are selected when the dummy cell selecting signal is in low level. That is, the signal line L5 that the dummy cell selecting signal is propagated corresponds to the dummy cell selecting circuit.

If the same data, for example, 1, is written to the dummy cells 4 in advance, when the dummy cell selecting signal becomes low level, current from all the dummy cells 4 flows through the dummy bit line sense amplifier 5. Accordingly, the sense amplifier 2 operates at high speed, and the activation timing of the sense amplifier 2 also speeds up in accordance with the operation of the sense amplifier 2.

Thus, according to the second embodiment, because the dummy cells 4 are selected by the dummy cell selecting signal aside from the main row address signal, the selecting timing of the memory cell 1 and the dummy cell 4 can be controlled separately, thereby enlarging a timing margin more than that of the first embodiment.

(Third Embodiment)

A third embodiment has a feature in which the number of the dummy cells selected simultaneously is set to an integral multiple of the number of the section word lines controlled by a main word line.

Figure 5:
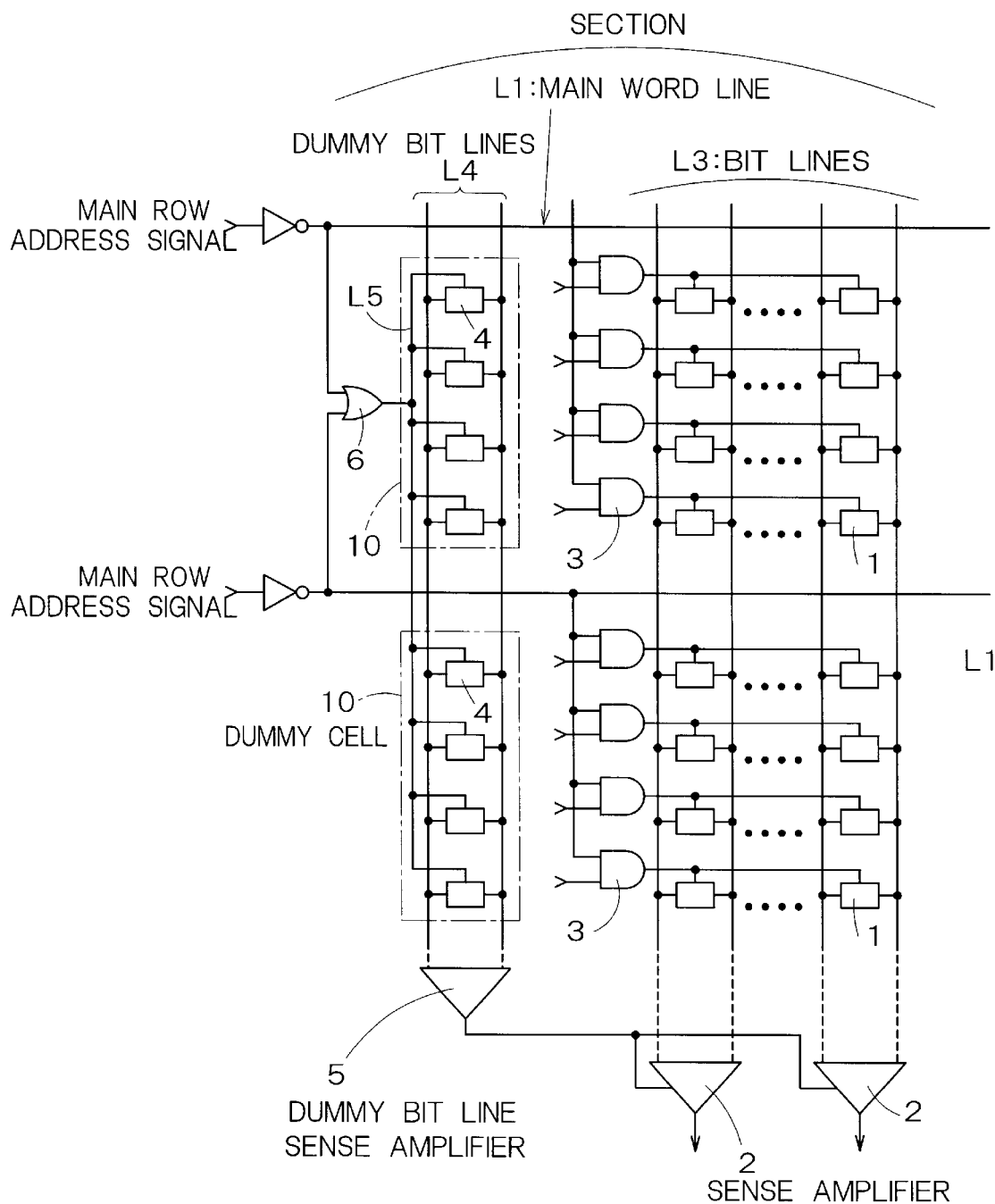
FIG. 5 is a block diagram of a third embodiment of a semiconductor memory circuit according to the present invention.

FIG. 5 is a block diagram of the third embodiment of the semiconductor according to the present invention. In FIG. 5, the same reference numerals are attached to common constituents with FIG. 1. Hereinafter, differences will mainly be described.

In the semiconductor memory circuit of FIG. 5, the dummy cell selecting circuit has an OR circuit 6 for outputting high level when at least one of the adjacent two main word lines is in high level. When the output of the OR circuit 6 becomes high level, all the dummy cells in a dummy cell group 10 provided by each of the adjacent two main word lines are selected. That is, when the output of the OR circuit becomes high level, the current from all the dummy cells in the adjacent two dummy cell group 10 flows through the dummy bit line sense amplifier 5. Accordingly, the dummy bit line sense amplifier 5 operates at high speed, and the activation timing of the sense amplifier 2 speeds up in accordance with the operation of the dummy bit line sense amplifier 5.

Although logical addition of the adjacent two main word lines are calculated in the dummy cell selecting circuit in FIG. 5, the logical addition of equal to or more than three of the main word lines may be calculated. In this case, if each of the dummy cells in the dummy cell group 10 is provided by each of the section word lines, the number of the dummy cells selected simultaneously becomes integer multiple of the section word lines connected to the main word line.

In the above-mentioned embodiment, although an example in which the dummy bit lines L4 are provided in units of section composed of a plurality of bit lines L3 has been described, the number of the dummy bit lines L4 is not limited. For example, the dummy bit line L4 may be provided by each of the main word line L1.

The semiconductor memory circuit according to the present invention can be applied to various memories such as an SRAM, a DRAM and a flash memory.

What is claimed is:

1. A semiconductor memory circuit, comprising:
   a plurality of bit lines;
   memory cells connected to each of said plurality of bit lines;
   sense amplifiers, each corresponding to one of said plurality of bit lines and each configured to amplify a voltage of the corresponding bit line;
   dummy bit lines;
   a plurality of dummy cells connected to said dummy bit lines;
   a dummy sense amplifier configured to output signals with voltages obtained by amplifying the voltages of said dummy bit lines, and to set an activation timing of said sense amplifier based on the output; and
   a dummy cell selecting circuit configured to simultaneously select at least two of said dummy cells, when said sense amplifier is activated.

2. The semiconductor memory circuit according to claim 1, wherein said memory cells being arranged in row and column directions, further comprising:
   a first word line configured to set to a selectable state a memory cell group composed of equal to or more than two of said memory cells and a dummy cell group composed of equal to or more than two of said dummy cells;
   a plurality of second word lines configured to select, in units of row, the memory cells included in said memory cell group set to the selectable state by said first word line; and
   word line selecting circuits, each corresponding to one of said plurality of second word lines and each setting logic of the corresponding second word line based on logics of said first word line and a column selecting signal,
   wherein said dummy cell selecting circuit simultaneously selects at least two of said dummy cells included in said dummy cell group selected by said first word line.

3. The semiconductor memory circuit according to claim 2,
   wherein said dummy cell selecting circuit controls whether or not to simultaneously select at least two of said dummy cells based on logic of a dummy cell selecting signal line connected to said first word line.

4. The semiconductor memory circuit according to claim 2,
   wherein said dummy cell selecting circuit controls whether or not to simultaneously select at least two of said dummy cells, in accordance with logic of a dummy selecting signal line provided separate from said first word line.

5. The semiconductor memory circuit according to claim 2,
   wherein said dummy cell selecting circuit simultaneously selects said dummy cells, the number of which is the same as that of said second word line.

6. The semiconductor memory circuit according to claim 1,
   wherein a channel width and a channel length of transistors composing said dummy cell are set substantially equal to those of transistors composing said memory cell.

7. The semiconductor memory circuit according to claim 1,
   wherein said dummy cell selecting circuit has number setting means capable of setting the number of said dummy cells selected simultaneously.

8. The semiconductor memory circuit according to claim 2,
   wherein said dummy cell selecting circuit simultaneously selects said dummy cells, the number of which is n (n is an integer equal to or more than 1) times the number of said second word line connected to said plurality of first lines.

9. The semiconductor memory circuit according to claim 2,
   wherein said dummy cell selecting circuit simultaneously selects at least two of said dummy cells from each of said plurality of dummy cell groups set to the selectable state by each of said plurality of first word lines.

10. The semiconductor memory circuit according to claim 2,
    wherein said dummy cell group has at least one of said dummy cell per each of said second word lines.

11. The semiconductor memory circuit according to claim 10,
    wherein said dummy cell selecting circuit simultaneously selects all the dummy cells included in said plurality of dummy cell groups set to the selectable state by said plurality of first word lines arranged adjacent to each other.

12. The semiconductor memory circuit according to claim 1,
    wherein the same data is stored in advance in all of said dummy cells.

* * * * *